United States Patent
Hsu et al.

(10) Patent No.: US 8,706,952 B2
(45) Date of Patent: Apr. 22, 2014

(54) FLASH MEMORY STORAGE DEVICE, CONTROLLER THEREOF, AND DATA PROGRAMMING METHOD THEREOF

(75) Inventors: Chih-Jen Hsu, Hsinchu County (TW); Yi-Hsiang Huang, Hsinchu (TW); Chung-Lin Wu, Taichung (TW)

(73) Assignee: Phison Electronics Corp., Miaoli (TW)

( * ) Notice: Subject to any disclaimer, the term of this patent is extended or adjusted under 35 U.S.C. 154(b) by 718 days.

(21) Appl. No.: 12/766,265

(22) Filed: Apr. 23, 2010

(65) Prior Publication Data

US 2011/0191525 A1  Aug. 4, 2011

(30) Foreign Application Priority Data

Feb. 4, 2010 (TW) .............................. 99103361 A (51) Int. Cl.
*G06F 12/00* (2006.01)
*G06F 13/00* (2006.01)
*G06F 13/28* (2006.01)
*G11C 11/34* (2006.01)
*G11C 16/04* (2006.01)
*G11C 7/00* (2006.01)

(52) U.S. Cl.
USPC . 711/103; 711/115; 365/185.11; 365/185.33; 365/185.29

(58) Field of Classification Search
None
See application file for complete search history.

(56) References Cited

U.S. PATENT DOCUMENTS

| | | | | |
|---|---|---|---|---|
| 2008/0002467 | A1* | 1/2008 | Tsuji | 365/185.11 |
| 2008/0126680 | A1* | 5/2008 | Lee et al. | 711/103 |
| 2008/0215800 | A1* | 9/2008 | Lee et al. | 711/103 |
| 2009/0248965 | A1* | 10/2009 | Lee et al. | 711/103 |
| 2009/0300269 | A1* | 12/2009 | Radke et al. | 711/103 |
| 2010/0011153 | A1* | 1/2010 | Yeh | 711/103 |
| 2010/0042772 | A1* | 2/2010 | Bonella et al. | 711/103 |
| 2010/0257308 | A1* | 10/2010 | Hsu et al. | 711/103 |
| 2010/0318839 | A1* | 12/2010 | Avila et al. | 714/5 |

* cited by examiner

*Primary Examiner* — Yaima Rigol
(74) *Attorney, Agent, or Firm* — J.C. Patents (57) ABSTRACT

A flash memory storage device, a controller thereof, and a data programming method are provided. The flash memory storage device has a flash memory comprising a plurality of physical blocks, each physical block includes a plurality of physical addresses, and the physical addresses comprises at least one fast physical address and at least one slow physical address. The method comprises at least grouping the physical blocks into a data area and a spare area; setting a predetermined block number; obtaining m physical blocks from the spare area, receiving a write command comprising a write data and a logical address, determining a logical address range of a buffer according to the logical address and the predetermined block number. When all logical addresses to be programmed with the write data are within the logical address range of the buffer, using a fast mode to program the data into the m physical blocks.

22 Claims, 8 Drawing Sheets

FLASH MEMORY STORAGE DEVICE, CONTROLLER THEREOF, AND DATA PROGRAMMING METHOD THEREOF

CROSS-REFERENCE TO RELATED APPLICATION

This application claims the priority benefit of Taiwan application serial no. 99103361, filed on Feb. 4, 2010. The entirety of the above-mentioned patent application is hereby incorporated by reference herein and made a part of this specification.

BACKGROUND OF THE INVENTION

1. Field of the Invention

The present invention relates to a data programming method. More particularly, the present invention relates to a data programming method simultaneously considering a programming speed and a storage capacity, a flash memory storage device and a flash memory controller.

2. Description of Related Art

Since a flash memory has advantages of non-volatile, low power consumption, small volume and non-mechanical structure, etc., it is widely used in various electronic devices. More and more portable storage devices such as memory cards or flash drives take the flash memory as a storage medium.

The flash memory has a plurality of physical blocks, and each of the physical blocks has a plurality of physical pages, wherein data is programmed into the physical block according to a sequence of the physical pages. Moreover, the flash memories can be classified into single level cell (SLC) NAND flash memories and multi level cell (MLC) NAND flash memories according to a number of bits that can be stored by each memory cell thereof. In the SLC NAND flash memory, each memory cell can only store one bit of data. In the MLC NAND flash memory, an electric charge in one memory cell can be identified using a plurality of levels. Therefore, in the MLC NAND flash memory, one memory cell can store multiple bits of data. Accordingly, in case of a same number of the memory cells, a page number of the MLC NAND flash memory is several times greater than that of the SLC NAND flash memory.

Because one memory cell may stores multiple bits of data in the MLC NAND flash memory, the program for the physical blocks of the MLC NAND flash memory includes a plurality of phases. Taking a 2 level cell NAND flash memory as an example, programming of the physical blocks includes a first phase and a second phase. In a first phase, lower pages are programmed, and a physical property thereof is similar to that of a SLC NAND flash memory, and after the first phase, upper pages are programmed. Generally, a programming speed of the lower page is faster than that of the upper page.

However, the pages with a relatively fast programming speed are generally only a part of the pages of the whole block, so that although a data programming speed can be improved if only the pages with the relatively fast programming speed are used, an applicable capacity of the flash memory is greatly reduced. Therefore, to use all of the storage capacity as much as possible, the pages with relatively fast or relatively slow programming speed are all used, though the data programming speed is reduced, and a whole programming efficiency cannot be improved.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

The present invention is directed to a data programming method, by which while a data programming speed is increased, a negative influence on storage capacity of a storage device is avoided.

The present invention is directed to a flash memory storage device, which can increase a data programming speed without excessively reducing usable space of a flash memory therein.

The present invention is directed to a flash memory controller, which is used in a storage device having a flash memory to achieve a fast programming speed and a large storage capacity of the storage device.

The present invention provides a data programming method, which is used in a storage device having a flash memory, wherein the flash memory includes a plurality of memory cells, and the memory cells are divided into a plurality of physical blocks, each of the physical blocks includes a plurality of physical addresses, and the physical addresses include at least one fast physical address and at least one slow physical address, and a speed for programming data into the fast physical address is faster than a speed for programming data into the slow physical address, each of the memory cells is used for storing n bits, wherein n is an integer greater than 1. The method can be described as follows. The physical blocks are at least grouped into a data area and a spare area, and a predetermined block number is set and m physical blocks are obtained from the spare area. A plurality of logical blocks is configured and each of the logical blocks includes a plurality of logical addresses, wherein each of the logical blocks is mapped to one of the physical blocks in the data area. A first write command sent by a host is received, and the first write command includes a first write data and a first logical address. A logical address range of a buffer represented by the m physical blocks is determined according to the first logical address and the predetermined block number. When all of the logical addresses to be programmed with the first write data are within the logical address range of the buffer, a fast mode is used to program the first write data into the m physical blocks, wherein only the fast physical addresses of the physical addresses are used for programming data in the fast mode.

The present invention provides a flash memory storage device including a connector, a flash memory and a flash memory controller. The connector is coupled to a host and receives write commands sent by the host. The flash memory includes a plurality of memory cells, and the memory cells are divided into a plurality of physical blocks, each of the physical blocks includes a plurality of physical addresses, and the physical addresses include at least one fast physical address and at least one slow physical address, wherein a speed for programming data into the fast physical address is faster than a speed for programming data into the slow physical address, and each of the memory cells is used for storing n bits, wherein n is an integer greater than 1. The flash memory controller is coupled to the flash memory and the connector, and is used for at least grouping the physical blocks into a data area and a spare area, setting a predetermined block number and obtaining m physical blocks from the spare area, and configuring a plurality of logical blocks, wherein each of the logical blocks includes a plurality of logical addresses, and each of the logical blocks is mapped to one of the physical blocks in the data area. When the flash memory controller receives a first write command sent by the host, wherein the first write command includes a first write data and a first logical address, the flash memory controller determines a logical address range of a buffer represented by the m physical blocks according to the first logical address and the predetermined block number, and determines whether all of the logical addresses to be programmed with the first write data are within the logical address range of the buffer. When all of the logical addresses to be programmed with the first write data are within the logical address range of the buffer, the flash memory controller uses a fast mode to program the first write data into the m physical blocks, wherein only the fast physical addresses of the physical addresses are used for programming data in the fast mode.

The present invention provides a flash memory controller disposed in a flash memory storage device coupled to a host, wherein the flash memory storage device includes a flash memory, the flash memory includes a plurality of memory cells, and the memory cells are divided into a plurality of physical blocks. Each of the physical blocks includes a plurality of physical addresses, and the physical addresses include at least one fast physical address and at least one slow physical address, wherein a speed for programming data into the fast physical address is faster than a speed for programming data into the slow physical address, and each of the memory cells is used for storing n bits, wherein n is an integer greater than 1. The flash memory controller includes a microprocessor unit, a flash memory interface unit, a host interface unit and a memory management unit. The flash memory interface unit is coupled to the microprocessor unit for coupling to the flash memory. The host interface unit is coupled to the microprocessor unit for coupling to the host. The memory management unit is coupled to the microprocessor unit, and is used for at least grouping the physical blocks into a data area and a spare area. The memory management unit sets a predetermined block number and obtains m physical blocks from the spare area, and configures a plurality of logical blocks, wherein each of the logical blocks includes a plurality of logical addresses, and each of the logical blocks is mapped to one of the physical blocks in the data area. When the host interface unit receives a first write command sent by the host, wherein the first write command includes a first write data and a first logical address, the memory management unit determines a logical address range of a buffer represented by the m physical blocks according to the first logical address and the predetermined block number, and determines whether all of the logical addresses to be programmed with the first write data are within the logical address range of the buffer. When all of the logical addresses to be programmed with the first write data are within the logical address range of the buffer, the memory management unit uses a fast mode to program the first write data into the m physical blocks, wherein only the fast physical addresses of the physical addresses are used for programming data in the fast mode.

According to the above descriptions, the logical address range of the buffer is dynamically determined, and as long as the logical addresses to be programmed with the write data are within the logical address range of the buffer, the fast physical addresses corresponding to the buffer are used to store the write data, so as to increase a programming speed. When the storage device enters an idle state, data in the buffer is processed. In this way, besides that the physical addresses with relatively fast programming speed in the flash memory can be used to increase the data programming speed, a negative influence on the usable space of the flash memory can be avoided.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1A:
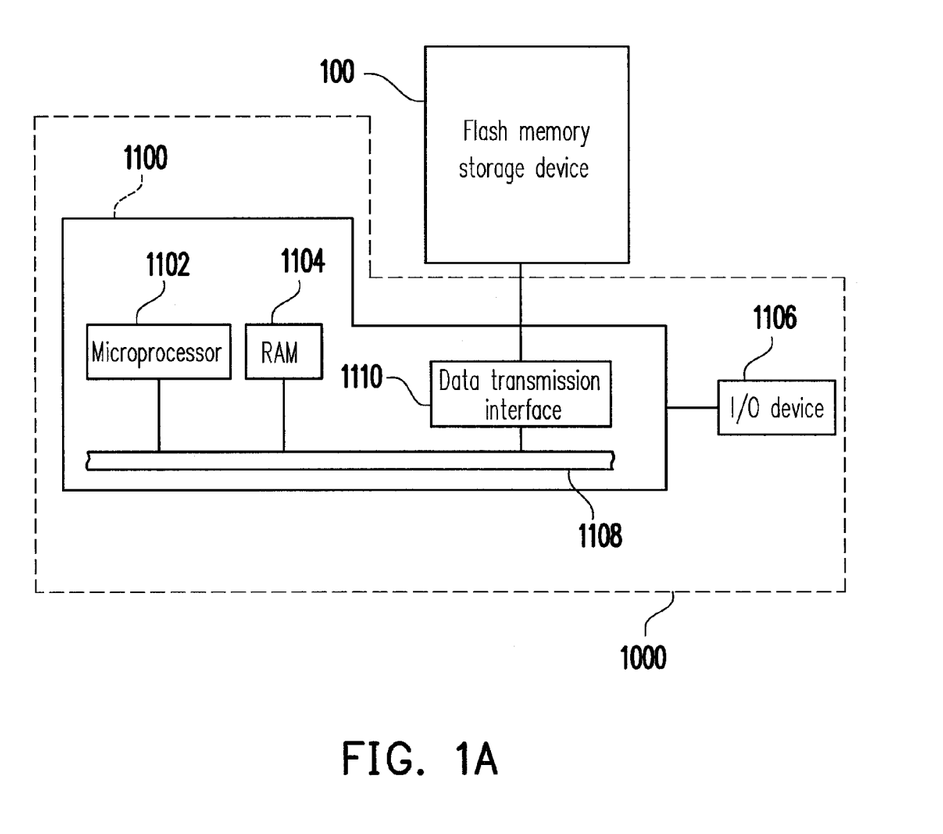
FIG. 1A is a schematic diagram illustrating a host system using a flash memory storage device according to an exemplary embodiment of the present invention.

FIG. 1A is a schematic diagram illustrating a host system using a flash memory storage device according to an exemplary embodiment of the present invention.

Figure 1B:
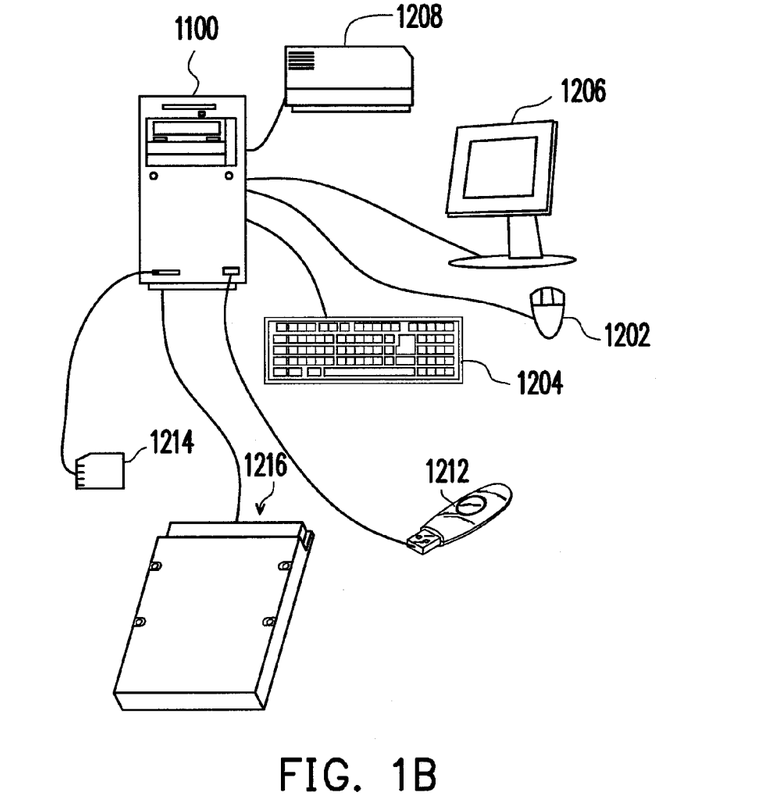
FIG. 1B is a schematic diagram illustrating a computer, an input/output device and a flash memory storage device according to an exemplary embodiment of the present invention.

Referring to FIG. 1A, the host system 1000 includes a computer 1100 and an input/output (IO) device 1106. The computer 1100 includes a microprocessor 1102, a random access memory (RAM) 1104, a system bus 1108 and a data transmission interface 1110. The I/O device 1106 includes a mouse 1202, a keyboard 1204, a display 1206 and a printer 1208 shown in FIG. 1B. It should be noticed that the devices shown in FIG. 1B are not used to limit the I/O device 1106, and the I/O device 1106 can further include other devices.

In the present exemplary embodiment, the flash memory storage device 100 is coupled to the other devices of the host system 1000 through the data transmission interface 1110. The host system 1000 can program data into or read data from the flash memory storage device 100 through processing of the microprocessor 1102, the RAM 1104 and the I/O device 1106. For example, the flash memory storage device 100 can be a memory card 1214, a flash drive 1212 or a solid state drive (SSD) 1216 shown in FIG. 1B.

Figure 1C:
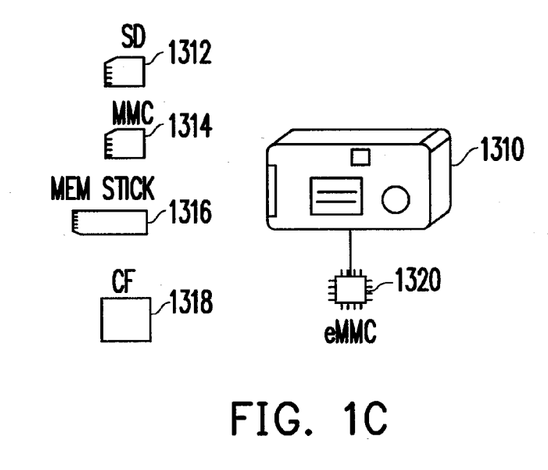
FIG. 1C is a schematic diagram illustrating a host system and a flash memory storage device according to another exemplary embodiment of the present invention.

Generally, the host system 100 can be any system capable of storing data, though in the present exemplary embodiment, the host system 1000 is assumed to be a computer system for description. However, in another exemplary embodiment of the present invention, the host system 1000 can also be a digital camera, a video camera, a communication device, an audio player or a video player, etc. For example, if the host system is a digital camera 1310, the flash memory storage device can be a secure digital (SD) card 1312, a multimedia card (MMC) 1314, a memory stick 1316, a compact flash (CF) card 1318 or an embedded storage device 1320 (shown in FIG. 1C). The embedded storage device 1320 includes an embedded MMC (eMMC). It should be noticed that the eMMC is directly coupled to a substrate of the host system.

Figure 1D:
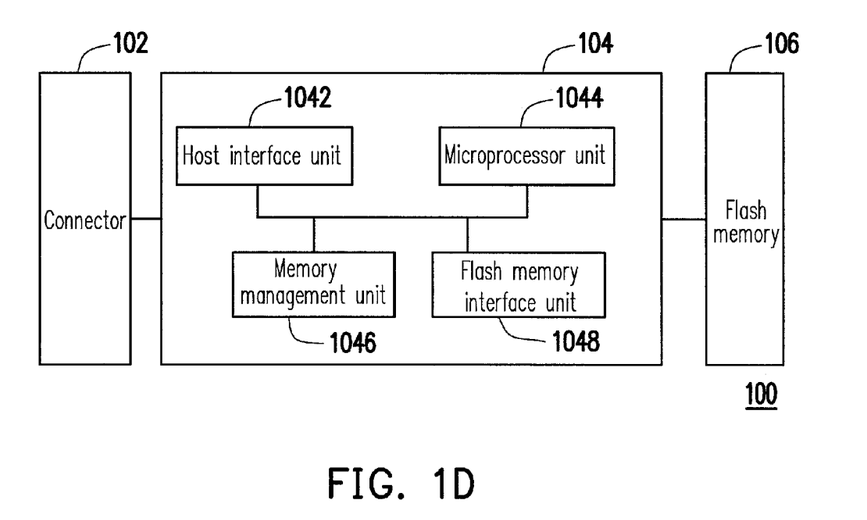
FIG. 1D is a block diagram illustrating a flash memory storage device of FIG. 1A.

FIG. 1D is a schematic block diagram illustrating the flash memory storage device 100 of FIG. 1A. Referring to FIG. 1D, the flash memory storage device 100 includes a connector 102, a flash memory controller 104 and a flash memory 106.

The connector 102 is coupled to the flash memory controller 104, and is used for coupling to the host system 1000. In the present exemplary embodiment, a type of a transmission interface supported by the connector 102 is a universal serial bus (USB) interface. However, in the other exemplary embodiments, the transmission interface of the connector 102 can also be any suitable interfaces such as a serial advanced technology attachment (SATA) interface, a parallel advanced technology attachment (PATA) interface, an institute of electrical and electronic engineers (IEEE) 1394 interface, a peripheral component interconnect express (PCI express) interface, a secure digital (SD) interface, a memory stick (MS) interface, a multimedia card (MMC) interface, a compact flash (CF) interface, or an integrated drive electronics (IDE) interface, etc., which is not limited by the present invention.

The flash memory controller 104 can execute a plurality of logic gate or control commands implemented by hardware or firmware, and can perform a program operation, a read operation or an erase operation to the flash memory 106 according to operation commands of the host system 1000. The flash memory controller 104 includes a host interface unit 1042, a microprocessor unit 1044, a memory management unit 1046 and a flash memory interface unit 1048.

The flash memory controller 104 is coupled to the host system 1000 through the host interface unit 1042 and the connector 102. In the present exemplary embodiment, the host interface unit 1042 is a USB interface, and in the other exemplary embodiments, the host interface unit 1042 can also be an interface unit complying with an SATA interface, a PATA interface, an IEEE 1394 interface, a PCI express interface, an SD interface, an MS interface, an MMC interface, a CF interface, an IDE interface or other interface standards.

The flash memory controller 104 is coupled to the flash memory 106 through the flash memory interface unit 1048, so as to perform related operations to the flash memory 106.

As shown in FIG. 1D, the host interface unit 1042, the memory management unit 1046 and the flash memory interface unit 1048 are all coupled to the microprocessor unit 1044, and the microprocessor unit 1044 is a main control unit of the flash memory controller 104, which is used for collaborating with the host interface unit 1042, the flash memory interface unit 1048 and the memory management unit 1046, etc. to perform various operations to the flash memory 106.

The memory management unit 1046 is used for executing a buffer management mechanism when the flash memory storage device 100 is coupled to the host system 1000. A detailed operation method of the memory management unit 1046 is described later.

Figure 2:
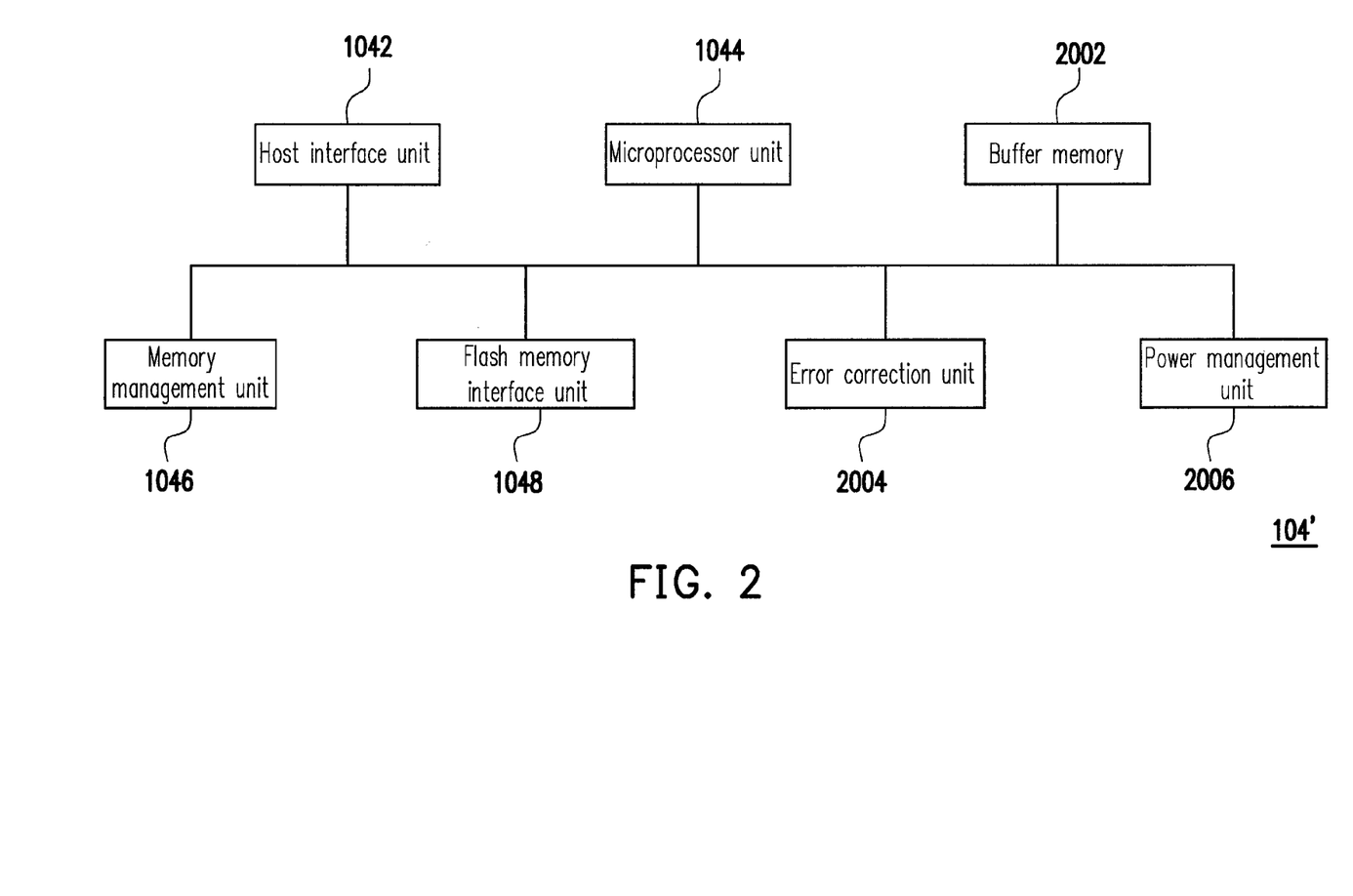
FIG. 2 is a block diagram illustrating a flash memory controller according to another exemplary embodiment of the present invention.

In another exemplary embodiment of the present invention, the flash memory controller of the flash memory storage device 100 further includes other function modules. FIG. 2 is a block diagram illustrating a flash memory controller according to another exemplary embodiment of the present invention. Referring to FIG. 2, besides the host interface unit 1042, the microprocessor unit 1044, the memory management unit 1046 and the flash memory interface unit 1048, the flash memory controller 104' further includes a buffer memory 2002, an error correction unit 2004, and a power management unit 2006.

In detail, the buffer memory 2002 is coupled to the microprocessor unit 1044, and is used for temporarily storing data sent from the host system 1000, or temporarily storing data sent from the flash memory 106.

The error correction unit 2004 is coupled to the microprocessor unit 1044, and is used for executing an error correction procedure to ensure correctness of data. In detail, when the flash memory controller 104' receives a write command from the host system 1000, the error correction unit 2004 generates a corresponding error checking and correcting code (ECC code) for the write data corresponding to the write command, and the write data and the corresponding ECC code are altogether programmed into the flash memory 106. When the flash memory controller 104' receives a read command from the host system 1000, the flash memory controller 104' reads data corresponding to the read command and the ECC code thereof from the flash memory 106. Now, the error correction unit 2004 can execute the error correction procedure to the read data according to the ECC code.

The power management unit 2006 is coupled to the microprocessor unit 1044, and is used for controlling a power supply of the flash memory storage device 100.

The flash memory 106 is used for storing system information such as a file allocation table (FAT), etc., and storing general data such as audio/video files and text files, etc. In the present exemplary embodiment, the flash memory 106 is a multi level cell (MLC) NAND flash memory, i.e. the flash memory 106 includes a plurality of memory cells, and each of the memory cells is used for storage n bits (n is an integer greater than 1). The memory cells are divided into a plurality of physical blocks, each of the physical blocks includes a plurality of physical addresses, and the physical addresses include at least one fast physical address and at least one slow physical address, wherein a speed for programming data into any of the fast physical addresses is faster than a speed for programming data into any of the slow physical addresses.

In the present exemplary embodiment, the memory management unit 1046 logically at least groups all of the physical blocks in the flash memory 106 into a data area and a spare area. In another exemplary embodiment, the physical blocks are, for example, logically grouped into a system area, a data area, a spare area and a replacement area.

The memory management unit 1046 obtains m physical blocks from the spare area to serve as a buffer according to a predetermined block number. For example, m can be a product of the predetermined block number and n, through the present invention is not limited thereto. Assuming the predetermined block number is represented by B, when each of the memory cells of the flash memory 106 is used for storing 2 bits of data, the memory management unit 1046 may obtain 2×B physical blocks from the spare area to serve as the buffer. When each of the memory cells of the flash memory 106 is used for storing 3 bits of data, the memory management unit 1046 may obtain 3×B physical blocks from the spare area to serve as the buffer.

In the present exemplary embodiment, when it is determined that data is about to be programmed into the buffer, the memory management unit 1046 only programs the data into the fast physical addresses in all of the physical addresses included in the m physical blocks. Assuming each of the memory cells in the flash memory 106 can store 2 bits of data, wherein the physical addresses of each of the physical blocks can be divided into lower pages and upper pages, and since a speed for programming data into the lower page is faster than a speed for programming data into the upper page, the memory management unit 1046 takes the lower pages as the fast physical addresses. If each of the memory cells in the flash memory 106 can store 3 bits of data, the physical addresses of each of the physical blocks can be divided into lower pages, middle pages, and upper pages with decreasing data programming speeds, and the memory management unit 1046 can take the lower pages as the fast physical addresses or take the lower pages and the middle pages as the fast physical addresses. In other words, the memory management unit 1046 regards the physical addresses in the physical block that have the fastest data programming speed as the fast physical addresses, or regards the physical addresses in the physical block that have the fastest data programming speed and the relatively fast programming speed as the fast physical addresses.

Assuming m is a product of the predetermined block number and n, and the memory management unit 1046 only regards the physical addresses having the fastest data programming speed as the fast physical addresses capable of being programmed, a storage capacity of the buffer capable of storing data is equal to a storage capacity corresponding to the predetermined block number.

Since the flash memory storage device 100 alternately uses the physical blocks in the flash memory 106 to store data to be programmed by the host system 1000, the memory management unit 1046 can configure a plurality of logical blocks to the host system 1000 for accessing data. Wherein, each of the logical blocks includes a plurality of logical addresses, and each of the logical blocks is mapped to one of the physical blocks in the data area, and each of the logical addresses in the logical block is mapped to a physical address in the corresponding physical block. In this way, the host system 1000 can access data only according to the logical addresses, and the memory management unit 1046 can accordingly access data of the mapped physical addresses.

In an exemplary embodiment of the present invention, when the host interface unit 1042 receives a first write data and a first logical address included in a first write command sent by the host system 1000, the memory management unit 1046 determines a logical address range of the buffer represented by the m physical blocks according to the predetermined block number and the first logical address in the first write command. Assuming the first logical address is A, and the capacity of the predetermined block number can store $L_{num}$ logical addresses, the logical address range of the buffer represented by the m physical blocks is then A to $A+L_{num}-1$. Further, as the first logical address is varied, the logical address range of the buffer is also changed.

The memory management unit 1046 first determines whether all of the logical addresses to be programmed with the first write data are within the logical address range of the buffer according to a content of the first write command. If yes, the memory management unit 1046 uses a fast mode to program the first write data into the m physical blocks. The fast mode represents that the memory management unit 1046 only programs data into the fast physical addresses of all of the physical addresses included in the buffer, so as to greatly increase a data programming speed. A method for programming the first write data into the fast physical addresses of the m physical blocks is described below with reference of figures.

However, if all of the logical addresses to be programmed with the first write data are not within the logical address range of the buffer (i.e. a size of the first write data exceeds an usable storage capacity of the buffer), the memory management unit 1046 uses a normal mode to program the first write data into the physical blocks of the flash memory 106 other than the m physical blocks. In the normal mode, the memory management unit 1046 uses the fast physical addresses and the slow physical addresses of the physical addresses for programming data. The memory management unit 1046 has to move valid data of the physical blocks in the data area to be programmed and the new data to be programmed to the physical blocks obtained from the spare area. Since the manner of programming data in this situation is the same to program data by alternatively using the physical blocks, detailed description thereof is not repeated.

In the present exemplary embodiment, once the host system 1000 does not send a command to the flash memory storage device 100 within a predetermined period of time (for example, 0.2 second), the memory management unit 1046 determines that the flash memory storage device 100 enters an idle state. Now, the memory management unit 1046 moves all of data programmed to the m physical blocks to the physical blocks obtained from the spare area, and associates the obtained physical blocks to the data area, and further erases the m physical blocks for a next utilization.

Before the above moving and erasing operations are executed, if the host system 1000 sends another write command to the flash memory storage device 100, the memory management unit 1046 first determines whether all of the logical addresses to be programmed by such write command are within the logical address range of the buffer, and further determines whether the buffer is used for storing data or the data is programmed to the flash memory 106 according to a general data programming method.

For simplicity's sake, the above write command sent by the host system 1000 is referred to as a second write command, wherein the second write command includes a second write data and a second logical address. When all of the logical addresses to be programmed with the second write data are not within the logical address range of the buffer, the memory management unit 1046 uses the normal mode to program the second write data into the physical blocks of the flash memory 106 other than the m physical blocks. In other words, when a part of the logical addresses to be programmed with the second write data are within the logical address range of the buffer, and another part of the logical addresses to be programmed with the second write data are not within the logical address range of the buffer, the memory management unit 1046 uses the normal mode to program the second write data into the physical blocks of the flash memory 106 other than the m physical blocks.

If all of the logical addresses to be programmed with the second write data are within the logical address range of the buffer, the memory management unit 1046 further determines whether the buffer is fully written (i.e. determines whether all of the fast physical addresses of the m physical blocks have been programmed with data).

If the buffer is fully written, the memory management unit 1046 moves valid data in the buffer to the physical blocks of the flash memory 106 other than the m physical blocks, and uses the fast mode to program the second write data into the m physical blocks. A method for moving the valid data of the buffer and a method for using the fast mode to program the second write data are described in detail later.

If the buffer is not fully written, the memory management unit 1046 further determines whether all of the logical addresses to be programmed with the second write data and the logical addresses already programmed with data in the buffer represented by the m physical blocks are overlapping or not.

If all of the logical addresses to be programmed with the second write data and the logical addresses already programmed with data in the buffer represented by the m physical blocks are overlapping, the memory management unit 1046 moves valid data in the buffer to the physical blocks of the flash memory 106 other than the m physical blocks, and uses the fast mode to program the second write data into the m physical blocks. If all of the logical addresses to be programmed with the second write data and the logical addresses already programmed with data in the buffer represented by the m physical blocks are not overlapping, the memory management unit 1046 directly uses the fast mode to program the second write data into the m physical blocks.

In case that the memory management unit 1046 determines that the buffer is fully written, or the logical addresses to be programmed and the logical addresses already programmed with data in the buffer represented by the m physical blocks are overlapping, a detailed method for the memory management unit 1046 moving the valid data of the buffer and a method for using the fast mode to program data are described below.

In an exemplary embodiment, the memory management unit 1046 may reorganize the whole buffer, and the memory management unit 1046 re-determines the logical address range of the buffer after erases the physical blocks included in the buffer. In detail, the memory management unit 1046 moves all of valid data in the m physical blocks currently serving as the buffer to the physical blocks obtained from the spare area, and then associates the physical blocks obtained from the spare area to the data area. Then, the memory management unit 1046 erases the m physical blocks originally serving as the buffer, and associates the m physical blocks to the spare area. The memory management unit 1046 again obtains m physical blocks from the spare area to serve as the buffer, and re-determines the logical address range of the buffer corresponding to the newly obtained m physical blocks according to the second logical address and the predetermined block number. Then, the memory management unit 1046 uses the fast mode to program the second write data into the m physical blocks.

In another exemplary embodiment, the memory management unit 1046 only processes the logical addresses in the buffer that are about to be programmed overlappingly. The memory management unit 1046 first moves valid data in the overlapping logical addresses to the physical blocks obtained from the spare area, and then uses the fast mode to program the second write data into the m physical blocks.

Figure 3A:
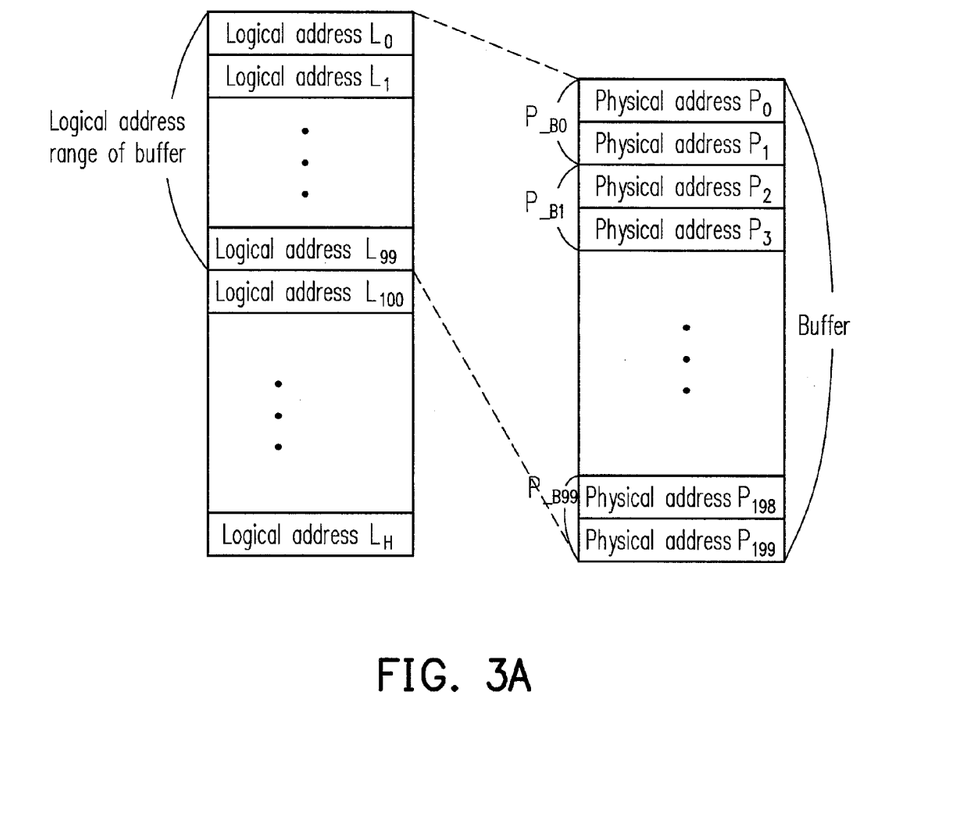
FIGS. 3A and 3B are schematic diagrams illustrating a corresponding relationship between a buffer and its logical address range according to an exemplary embodiment of the present invention.

FIG. 3A is a schematic diagram illustrating a corresponding relationship between the buffer and its logical address range according to an exemplary embodiment of the present invention. In the present exemplary embodiment, assuming the predetermined block number is 50, each memory cell of the flash memory 106 is used for storing 2 bits of data, each physical block in the flash memory 106 includes two physical addresses, and the memory management unit 1056 obtains 100 physical blocks from the spare area to serve as the buffer. As shown in FIG. 3A, the 100 physical blocks are, for example, numbered as $P_{\_B0}$-$P_{\_B99}$, and the physical addresses included in the physical blocks $P_{\_B0}$-$P_{\_B99}$ are, for example, numbered as $P_0$-$P_{199}$. Moreover, in the physical addresses $P_0$-$P_{199}$, assuming the physical addresses $P_0$, $P_2$, $P_4$, ..., $P_{198}$ with even numbers are belonged to the fast physical addresses. It should be noticed that the above assumptions are only used as an example, which is not used for limiting the present invention.

When the flash memory storage device 100 receives the first write command and the first write data therein from the host system 1000, if the first logical address included in the first write command is $L_0$, the logical address range of the buffer (i.e. the physical blocks $P_{\_B0}$-$P_{\_B99}$) is $L_0$-$L_{99}$. In other words, the logical address $L_0$ corresponds to the physical address $P_0$ in the physical block $P_{\_B0}$, the logical address $L_1$ corresponds to the physical address $P_2$ in the physical block $P_{\_B1}$, and the others are deduced by analogy.

If the logical addresses to be programmed with the first write data are the logical addresses $L_0$-$L_{29}$, since the logical addresses $L_0$-$L_{29}$ are totally within the logical address range of the buffer, the memory management unit 1046 uses the fast mode to correspondingly program the first write data into the physical addresses $P_0$, $P_2$, $P_4$, ..., $P_{58}$.

However, if the logical addresses to be programmed with the first write data are the logical addresses $L_0$-$L_{100}$, since a part of the logical addresses $L_0$-$L_{100}$ exceeds the logical address range of the buffer, the memory management unit 1046 uses the normal mode to program the first write data into the physical blocks in the flash memory 106 other than the physical blocks $P_{\_B0}$-$P_{\_B99}$.

After the data programming operation is completed, when the memory management unit 1046 determines that the flash memory storage device 100 enters the idle state, the memory management unit 1046 performs a data moving operation to the buffer. Before the data moving operation is executed, assuming the flash memory storage device 100 further receives a second write command and a corresponding second write data from the host system 1000. If the logical addresses to be programmed with the second write data are the logical addresses $L_{50}$-$L_{59}$, since the logical addresses $L_{50}$-$L_{59}$ are all within the logical address range of the buffer, the memory management unit 1046 correspondingly programs the second write data into the buffer, i.e. programs the second write data into the physical addresses $P_{100}$, $P_{102}$, $P_{104}$, ..., $P_{118}$.

However, if a part of the logical addresses to be programmed with the second write data exceeds the logical address range of the buffer (for example, the logical addresses to be programmed with the second write data are $L_{50}$-$L_{110}$), or the logical addresses to be programmed with the second write data totally exceed the logical address range of the buffer (for example, the logical addresses to be programmed with the second write data are $L_{199}$-$L_{250}$), the memory management unit 1046 uses the normal mode to program the second write data into the other physical blocks of the flash memory 106 according to a general data programming method of the flash memory.

Regarding any of the write commands received before the flash memory storage device 100 enters the idle state, as long as the logical addresses to be programmed by the write command are all within the logical address range of the buffer (i.e. the logical addresses $L_0$-$L_{99}$), the write data corresponding to the write command can be correspondingly stored to the fast physical addresses of the physical blocks $P_{\_B0}$-$P_{\_B99}$.

Once the memory management unit 1046 determines that the flash memory storage device 100 enters the idle state, the memory management unit 1046 moves all data programmed into the physical blocks $P_{\_B0}$-$P_{\_B99}$ to the physical blocks obtained from the spare area, and erases the physical blocks $P_{\_B0}$-$P_{\_B99}$. In other words, the physical blocks serving as the buffer are again associated to the spare area of the flash memory 106.

Figure 3B:
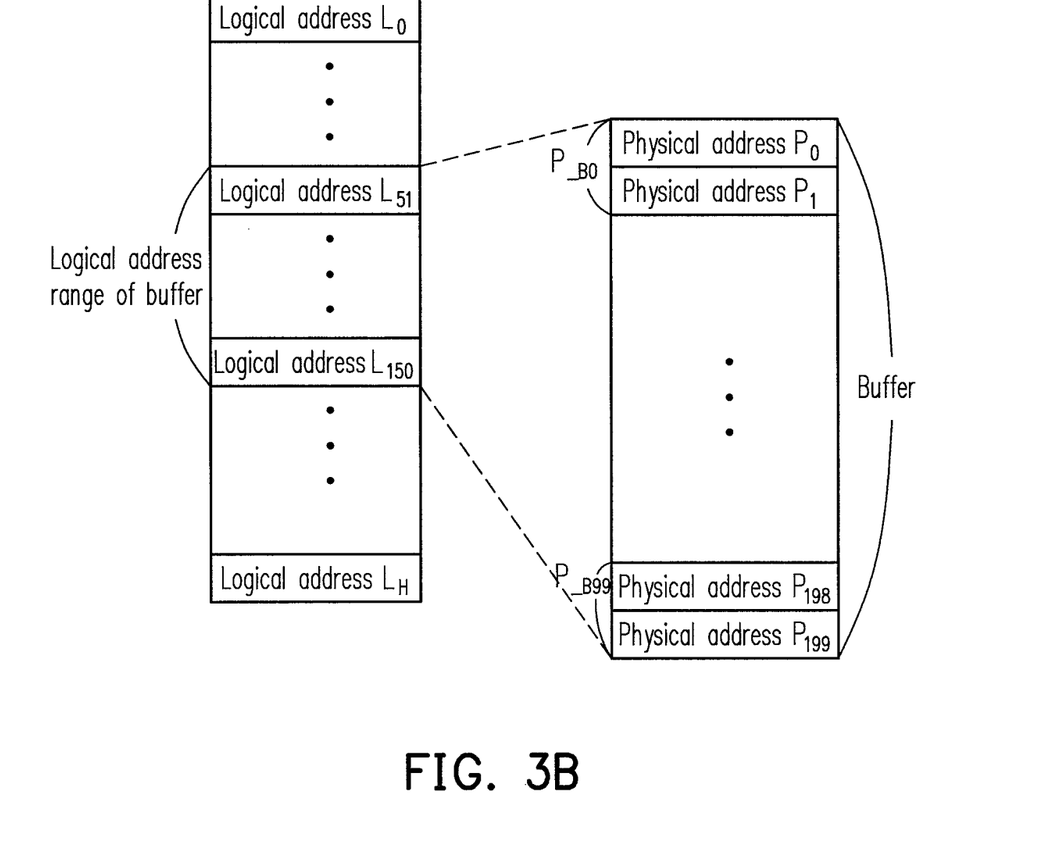

Then, when the flash memory storage device 100 receives a write command and a corresponding write data, if the logical address in such write command is $L_{51}$, as shown in FIG. 3B, the memory management unit 1046 defines the logical addresses $L_{51}$-$L_{150}$ as a current logical address range of the buffer. Now, the 100 physical blocks (for example, the physical blocks numbered as $P_{\_B0}$-$P_{\_B99}$) obtained from the spare area by the memory management unit 1046 correspond to the logical addresses $L_{51}$-$L_{150}$. For example, the logical address $L_{51}$ corresponds to the physical address $P_0$ in the physical block $P_{\_B0}$, and the logical address $L_{150}$ corresponds to the physical address $P_{198}$ in the physical block $P_{\_B99}$.

After the logical address range of the buffer is determined, as long as the logical addresses to be programmed by the write command are all within the logical address range of the buffer (i.e. within the logical addresses $L_{51}$-$L_{150}$), the write data corresponding to the write command can be correspondingly stored to the fast physical addresses of the physical blocks $P_{\_B0}$-$P_{\_B99}$.

As described above, when the logical addresses to be programmed are within the logical address range of the buffer, the corresponding fast physical addresses in the buffer are used to store data, so as to increase the data programming speed. Once the program operation is completed, data in the buffer are moved when the flash memory storage device 100 enters the idle state. Since the logical address range of the buffer is varied according to the logical address of the received write command, the logical addresses with relatively fast programming speed are not fixed, but are dynamically changed.

Figure 4:
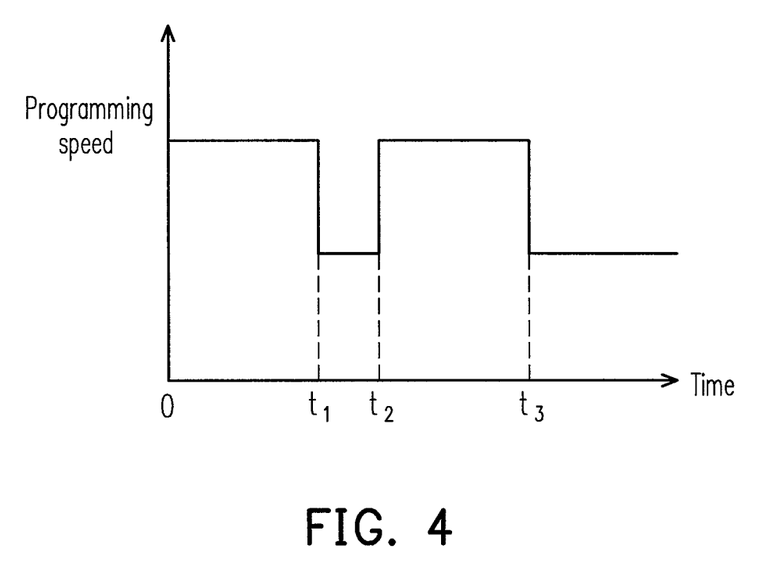
FIG. 4 is a curve diagram of programming speed and time according to an exemplary embodiment of the present invention.

FIG. 4 is a curve diagram of programming speed and time according to an exemplary embodiment of the present invention. As shown in FIG. 4, as long as the buffer is not fully written, data can be programmed with a relatively fast speed (for example, during a time section 0-$t_1$). Once the buffer is fully written (for example, at a time point $t_1$), the programming speed is recovered back to a generally data programming speed. However, after the buffer is erased during the idle state of the flash memory storage device 100 (for example, at a time point $t_2$), a programming speed of the write command is again increased (for example, during a time section $t_2$-$t_3$).

Figure 5:
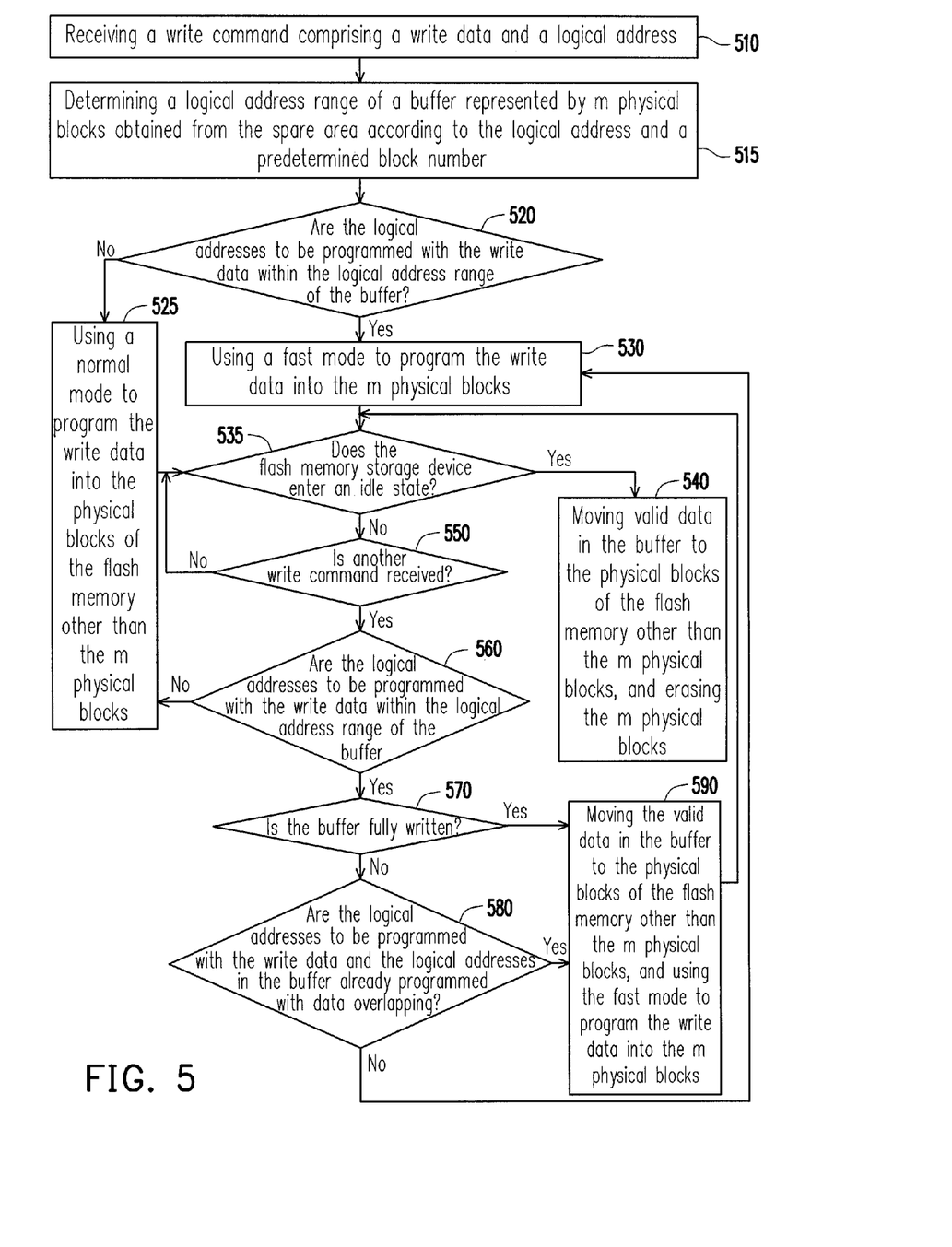
FIG. 5 is a flowchart illustrating a data programming method according to an exemplary embodiment of the present invention.

FIG. 5 is a flowchart illustrating a data programming method according to an exemplary embodiment of the present invention.

As shown in FIG. 5, in step 510, the flash memory storage device 100 receives a write command from the host system 1000, wherein the write command includes a write data and a logical address.

In step 515, the memory management unit 1046 in the flash memory controller 104 determines a logical address range of a buffer represented by m physical blocks obtained from the spare area according to the logical address and a predetermined block number.

In step 520, the memory management unit 1046 determines whether the logical addresses to be programmed with the write data are within the logical address range of the buffer. If yes, in step 530, the memory management unit 1046 uses a fast mode to program the write data into the m physical blocks. If not, in step 525, the memory management unit 1046 uses a normal mode to program the write data into the other physical blocks of the flash memory 106.

Next, in step 535, the memory management unit 1046 determines whether the flash memory storage device 100 enters an idle state. If the flash memory storage device 100 does not enter the idle state, in step 550, the memory management unit 1046 determines whether the flash memory storage device 100 receives another write command from the host system 1000. If the other write command is not received, the memory management unit 1046 repeats the determinations of the steps 535 and 550. During such process, if the memory management unit 1046 determines that flash memory storage device 100 enters the idle state, as shown in step 540, the memory management unit 1046 moves valid data programmed to the m physical blocks to the other physical blocks of the flash memory 106, and erases the m physical blocks. If the flash memory storage device 100 receives the other write command, in step 560, the memory management unit 1046 determines whether the logical addresses to be programmed with the write data included in such write command are within the logical address range of the buffer. If not, as shown in the step 525, the memory management unit 1046 uses the normal mode to program the write data into the other physical blocks of the flash memory 106. If yes, in step 570, the memory management unit 1046 determines whether the buffer is fully written.

If the buffer is fully written, in step 590, the memory management unit 1046 moves the valid data in the buffer to the physical blocks of the flash memory 106 other than the m physical blocks, and uses the fast mode to program the other write data into the m physical blocks.

However, if the buffer is not fully written, in step 580, the memory management unit 1046 determines whether the logical addresses to be programmed with the write data and the logical addresses already programmed with data in the buffer represented by the m physical blocks are overlapping. If yes, as shown in the step 590, the memory management unit 1046 moves the valid data in the buffer to the physical blocks of the flash memory 106 other than the m physical blocks, and uses the fast mode to program the other write data into the m physical blocks. If not, as shown in the step 530, the memory management unit 1046 uses the fast mode to program the other write data into the m physical blocks.

As shown in FIG. 5, once the logical address range of the buffer is determined, in the data programming method of the present exemplary embodiment, the steps 530 to 590 are repeated until the memory management unit 1046 determines that the flash memory storage device 100 enters the idle state, and then data in the buffer is reorganized. Then, when the flash memory storage device 100 again receives another write command, the logical address range of the buffer is re-determined according to various steps of FIG. 5, and data is programmed to the flash memory 106.

In an exemplary embodiment of the present invention, only when the memory management unit 1046 determines that a size of the write data corresponding to the write command sent by the host system 1000 is greater than a predetermined value, the buffer is used to achieve a purpose of fast data programming. Alternately, only when the memory management unit 1046 determines sizes of the write data to be programmed by a specific number of write commands are all greater than the predetermined value, and the logical addresses to be programmed with the write data are continuous, the buffer is used to achieve a purpose of fast data programming. In an exemplary embodiment of the present invention, the predetermined value is 5 MB, though the present invention is not limited thereto.

In an exemplary embodiment of the present invention, the predetermined block number can be adjusted according to a size of the write data. When the memory management unit 1046 determines that the host system 1000 issues a sequential write request and a data amount is relatively large, the predetermined block number can be increased to further improve a data programming efficiency.

The previously described exemplary embodiments of the present invention have many advantages, including increasing the data programming speed by obtaining a part of the physical blocks to serve as the buffer, and when determining the buffer can be used, programming data into the fast physical addresses of the buffer. After the flash memory storage device enters the idle state, the data in the buffer can be moved. In this way, a purpose of increasing the data programming speed can be achieved without excessive decreasing usable capacity of the flash memory. The advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data programming method for a storage device having a flash memory, wherein the flash memory comprises a plurality of memory cells, and the memory cells are divided into a plurality of physical blocks, each of the physical blocks comprises a plurality of physical addresses, and the physical addresses comprise at least one fast physical address and at least one slow physical address, and a speed for programming data into the at least one fast physical address is faster than a speed for programming data into the at least one slow physical address, each of the memory cells is used for storing n bits, wherein n is an integer greater than 1 and smaller than 5, and the data programming method comprising:

at least grouping the physical blocks into a data area and a spare area;

setting a predetermined block number, and obtaining m physical blocks from the spare area, wherein m is a finite integer greater than 1 and no higher than a total block number of the spare area;

configuring a plurality of logical blocks, wherein each of the logical blocks comprises a plurality of logical addresses, each of the logical blocks is mapped to one of the physical blocks in the data area, and both the at least one fast physical address and the at least one slow physical address of the physical blocks in the data area are used for programming data in a normal mode;

receiving a first write command sent by a host, wherein the first write command comprises a first write data and a first logical address of the logical addresses;

determining a logical address range of a buffer represented by the m physical blocks according to the first logical address and the predetermined block number, wherein the logical address range is among the logical blocks, the logical addresses in the logical address range are mapped to the at least one fast physical address and the at least one slow physical address of at least one of the physical blocks in the data area before the logical address range is determined, and are only mapped to the fast physical addresses of the m physical blocks after the logical address range is determined;

determining whether all of the logical addresses to be programmed with the first write data are within the logical address range of the buffer; and using a fast mode to program the first write data into the m physical blocks when all of the logical addresses to be programmed with the first write data are within the logical address range of the buffer, wherein only the fast physical addresses of the physical addresses are used for programming data in the fast mode.

2. The data programming method as claimed in claim 1, wherein after the step of determining whether all of the logical addresses to be programmed with the first write data are within the logical address range of the buffer, the method further comprises:

using the normal mode to program the first write data into the physical blocks of the flash memory other than the m physical blocks when all of the logical addresses to be programmed with the first write data are not within the logical address range of the buffer, wherein the fast physical addresses and the slow physical addresses of the physical addresses are used for programming data in the normal mode.

3. The data programming method as claimed in claim 1, further comprising:

receiving a second write command sent by the host, wherein the second write command comprises a second write data and a second logical address;

determining whether all of the logical addresses to be programmed with the second write data are within the logical address range of the buffer; and using the normal mode to program the second write data into the physical blocks of the flash memory other than the m physical blocks when all of the logical addresses to be programmed with the second write data are not within the logical address range of the buffer, wherein the fast physical addresses and the slow physical addresses of the physical addresses are used for programming data in the normal mode.

4. The data programming method as claimed in claim 3, wherein after the step of determining whether all of the logical addresses to be programmed with the second write data are within the logical address range of the buffer, the method further comprises:

determining whether the buffer is fully written when all of the logical addresses to be programmed with the second write data are within the logical address range of the buffer; and moving valid data in the buffer to the physical blocks of the flash memory other than the m physical blocks when the buffer is fully written, and using the fast mode to program the second write data into the m physical blocks.

5. The data programming method as claimed in claim 4, wherein after the step of determining whether the buffer is fully written, the method further comprises:
  when the buffer is not fully written, determining whether all of the logical addresses to be programmed with the second write data and the logical addresses already programmed with data in the buffer represented by the m physical blocks are overlapping; and
  moving valid data in the buffer to the physical blocks of the flash memory other than the m physical blocks when all of the logical addresses to be programmed with the second write data and the logical addresses already programmed with data in the buffer represented by the m physical blocks are overlapping, and using the fast mode to program the second write data into the m physical blocks.

6. The data programming method as claimed in claim 5, wherein after the step of determining whether all of the logical addresses to be programmed with the second write data and the logical addresses already programmed with data in the buffer represented by the m physical blocks are overlapping, the method further comprises:
  using the fast mode to program the second write data into the m physical blocks when all of the logical addresses to be programmed with the second write data and the logical addresses already programmed with data in the buffer represented by the m physical blocks are not overlapping.

7. The data programming method as claimed in claim 1, further comprising:
  determining whether a size of the first write data is greater than or equal to a predetermined value, and using the fast mode to program the first write data into the m physical blocks when the size of the first write data is greater than or equal to the predetermined value and all of the logical addresses to be programmed with the first write data are within the logical address range of the buffer.

8. The data programming method as claimed in claim 1, wherein an initial logical address of the logical address range is determined according to the first logical address, and a capacity of the logical address range is determined according to a capacity of the predetermined block number, the data programming method further comprising:
  receiving a second write command sent by the host, wherein the second write command comprises a second write data and a second logical address of the logical addresses, and the second write command is different from the first write command; and
  re-determining the logical address range according to the second logical address and the predetermined block number, wherein an initial logical address of the re-determined logical address range is determined according to the second logical address.

9. A flash memory storage device, comprising:
  a connector, coupled to a host, and receiving write commands sent by the host;
  a flash memory, comprising a plurality of memory cells, wherein the memory cells are divided into a plurality of physical blocks, each of the physical blocks comprises a plurality of physical addresses, and the physical addresses comprise at least one fast physical address and at least one slow physical address, wherein a speed for programming data into the at least one fast physical address is faster than a speed for programming data into the at least one slow physical address, and each of the memory cells is used for storing n bits, wherein n is an integer greater than 1 and smaller than 5; and
  a flash memory controller, coupled to the flash memory and the connector, for at least grouping the physical blocks into a data area and a spare area, setting a predetermined block number and obtaining m physical blocks from the spare area, and configuring a plurality of logical blocks, wherein m is a finite integer greater than 1 and no higher than a total block number of the spare area, each of the logical blocks comprises a plurality of logical addresses, each of the logical blocks is mapped to one of the physical blocks in the data area, and both the at least one fast physical address and the at least one slow physical address of the physical blocks in the data area are used for programming data in a normal mode,
  when the flash memory controller receives a first write command sent by the host, wherein the first write command comprises a first write data and a first logical address of the logical addresses, the flash memory controller determines a logical address range of a buffer represented by the m physical blocks according to the first logical address and the predetermined block number, wherein the logical address range is among the logical blocks, the logical addresses in the logical address range are mapped to the at least one fast physical address and the at least one slow physical address of at least one of the physical blocks in the data area before the logical address range is determined, and are only mapped to the fast physical addresses of the m physical blocks after the logical address range is determined,
  wherein the flash memory controller determines whether all of the logical addresses to be programmed with the first write data are within the logical address range of the buffer,
  when all of the logical addresses to be programmed with the first write data are within the logical address range of the buffer, the flash memory controller uses a fast mode to program the first write data into the m physical blocks, wherein only the fast physical addresses of the physical addresses are used for programming data in the fast mode.

10. The flash memory storage device as claimed in claim 9, wherein when all of the logical addresses to be programmed with the first write data are not within the logical address range of the buffer, the flash memory controller uses the normal mode to program the first write data into the physical blocks of the flash memory other than the m physical blocks, wherein the fast physical addresses and the slow physical addresses of the physical addresses are used for programming data in the normal mode.

11. The flash memory storage device as claimed in claim 9, wherein when the flash memory controller receives a second write command sent by the host, wherein the second write command comprises a second write data and a second logical address, the flash memory controller determines whether all of the logical addresses to be programmed with the second write data are within the logical address range of the buffer,
  when all of the logical addresses to be programmed with the second write data are not within the logical address range of the buffer, the flash memory controller uses the normal mode to program the second write data into the physical blocks of the flash memory other than the m physical blocks, wherein the fast physical addresses and the slow physical addresses of the physical addresses are used for programming data in the normal mode.

12. The flash memory storage device as claimed in claim 11, wherein when all of the logical addresses to be programmed with the second write data are within the logical address range of the buffer, the flash memory controller determines whether the buffer is fully written, if the buffer is fully written, the flash memory controller moves valid data in the buffer to the physical blocks of the flash memory other than the m physical blocks, and uses the fast mode to program the second write data into the m physical blocks.

13. The flash memory storage device as claimed in claim 12, wherein if the buffer is not fully written, the flash memory controller determines whether all of the logical addresses to be programmed with the second write data and the logical addresses already programmed with data in the buffer represented by the m physical blocks are overlapping, if all of the logical addresses to be programmed with the second write data and the logical addresses already programmed with data in the buffer represented by the m physical blocks are overlapping, the flash memory controller moves valid data in the buffer to the physical blocks of the flash memory other than the m physical blocks, and uses the fast mode to program the second write data into the m physical blocks.

14. The flash memory storage device as claimed in claim 13, wherein if all of the logical addresses to be programmed with the second write data and the logical addresses already programmed with data in the buffer represented by the m physical blocks are not overlapping, the flash memory controller uses the fast mode to program the second write data into the m physical blocks.

15. The flash memory storage device as claimed in claim 9, wherein the flash memory controller determines whether a size of the first write data is greater than or equal to a predetermined value, and when the size of the first write data is greater than or equal to the predetermined value and all of the logical addresses to be programmed with the first write data are within the logical address range of the buffer, the flash memory controller uses the fast mode to program the first write data into the m physical blocks.

16. A flash memory controller, disposed in a flash memory storage device coupled to a host, wherein the flash memory storage device comprises a flash memory, and the flash memory comprises a plurality of memory cells, and the memory cells are divided into a plurality of physical blocks, each of the physical blocks comprises a plurality of physical addresses, and the physical addresses comprise at least one fast physical address and at least one slow physical address, wherein a speed for programming data into the at least one fast physical address is faster than a speed for programming data into the at least one slow physical address, and each of the memory cells is used for storing n bits, wherein n is an integer greater than 1 and smaller than 5, and the flash memory controller comprising:

a microprocessor unit;

a flash memory interface unit, coupled to the microprocessor unit for coupling to the flash memory;

a host interface unit, coupled to the microprocessor unit for coupling to the host; and a memory management unit, coupled to the microprocessor unit, for at least grouping the physical blocks into a data area and a spare area, setting a predetermined block number and obtaining m physical blocks from the spare area, and configuring a plurality of logical blocks, wherein m is a finite integer greater than 1 and no higher than a total block number of the spare area, each of the logical blocks comprises a plurality of logical addresses, each of the logical blocks is mapped to one of the physical blocks in the data area, and both the at least one fast physical address and the at least one slow physical address of the physical blocks in the data area are used for programming data in a normal mode, when the host interface unit receives a first write command sent by the host, wherein the first write command comprises a first write data and a first logical address of the logical addresses, the memory management unit determines a logical address range of a buffer represented by the m physical blocks according to the first logical address and the predetermined block number, wherein the logical address range is among the logical blocks, the logical addresses in the logical address range are mapped to the at least one fast physical address and the at least one slow physical address of at least one of the physical blocks in the data area before the logical address range is determined, and are only mapped to the fast physical addresses of the m physical blocks after the logical address range is determined, wherein the memory management unit determines whether all of the logical addresses to be programmed with the first write data are within the logical address range of the buffer, when all of the logical addresses to be programmed with the first write data are within the logical address range of the buffer, the memory management unit uses a fast mode to program the first write data into the m physical blocks, wherein only the fast physical addresses of the physical addresses are used for programming data in the fast mode.

17. The flash memory controller as claimed in claim 16, wherein when all of the logical addresses to be programmed with the first write data are not within the logical address range of the buffer, the memory management unit uses the normal mode to program the first write data into the physical blocks of the flash memory other than the m physical blocks, wherein the fast physical addresses and the slow physical addresses of the physical addresses are used for programming data in the normal mode.

18. The flash memory controller as claimed in claim 16, wherein when the host interface unit receives a second write command sent by the host, wherein the second write command comprises a second write data and a second logical address, the memory management unit determines whether all of the logical addresses to be programmed with the second write data are within the logical address range of the buffer, when all of the logical addresses to be programmed with the second write data are not within the logical address range of the buffer, the memory management unit uses the normal mode to program the second write data into the physical blocks of the flash memory other than the m physical blocks, wherein the fast physical addresses and the slow physical addresses of the physical addresses are used for programming data in the normal mode.

19. The flash memory controller as claimed in claim 18, wherein when all of the logical addresses to be programmed with the second write data are within the logical address range of the buffer, the memory management unit determines whether the buffer is fully written, if the buffer is fully written, the memory management unit moves valid data in the buffer to the physical blocks of the flash memory other than the m physical blocks, and uses the fast mode to program the second write data into the m physical blocks.

20. The flash memory controller as claimed in claim 19, wherein if the buffer is not fully written, the memory management unit determines whether all of the logical addresses to be programmed with the second write data and the logical addresses already programmed with data in the buffer represented by the m physical blocks are overlapping,
if all of the logical addresses to be programmed with the second write data and the logical addresses already programmed with data in the buffer represented by the m physical blocks are overlapping, the memory management unit moves valid data in the buffer to the physical blocks of the flash memory other than the m physical blocks, and uses the fast mode to program the second write data into the m physical blocks.

21. The flash memory controller as claimed in claim 20, wherein if all of the logical addresses to be programmed with the second write data and the logical addresses already programmed with data in the buffer represented by the m physical blocks are not overlapping, the memory management unit uses the fast mode to program the second write data into the m physical blocks.

22. The flash memory controller as claimed in claim 16, wherein the memory management unit determines whether a size of the first write data is greater than or equal to a predetermined value, and when the size of the first write data is greater than or equal to the predetermined value and all of the logical addresses to be programmed with the first write data are within the logical address range of the buffer, the memory management unit uses the fast mode to program the first write data into the m physical blocks.

* * * * *